United States Patent
Lee et al.

(10) Patent No.: US 7,534,553 B2
(45) Date of Patent: May 19, 2009

(54) METHOD FOR FABRICATING SEMICONDUCTOR DEVICE

(75) Inventors: Sung-Kwon Lee, Kyoungki-do (KR); Gyu-Dong Park, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 282 days.

(21) Appl. No.: 11/264,427

(22) Filed: Oct. 31, 2005

(65) Prior Publication Data

US 2006/0134560 A1  Jun. 22, 2006

(30) Foreign Application Priority Data

Dec. 20, 2004  (KR) .................. 10-2004-0108684

(51) Int. Cl.
*G03F 7/26* (2006.01)
(52) U.S. Cl. ...................... 430/311; 430/315
(58) Field of Classification Search ........... 430/311, 430/314, 315, 313
See application file for complete search history.

(56) References Cited

U.S. PATENT DOCUMENTS

| | | |
|---|---|---|
| 6,337,282 B2 | 1/2002 | Kim et al. |
| 6,828,239 B2 | 12/2004 | En-Ho et al. |
| 7,018,928 B2 * | 3/2006 | Hsu et al. ............ 438/705 |
| 2004/0161919 A1 * | 8/2004 | Cha et al. ............ 438/618 |

FOREIGN PATENT DOCUMENTS

| | | |
|---|---|---|
| JP | 8-250397 | 9/1996 |
| JP | 9-232316 | 9/1997 |
| JP | 2001-135591 | 5/2001 |
| KR | 2002-0047647 | 6/2002 |
| KR | 10-2004-0058968 | 7/2004 |

OTHER PUBLICATIONS

English Translation of KR-10-2002-0047647 (Jun. 2002).*
English Translation of JP 08-250397 (Sep. 1996).*

* cited by examiner

*Primary Examiner*—Kathleen Duda
*Assistant Examiner*—Brittany Raymond
(74) *Attorney, Agent, or Firm*—Blakely, Sokoloff, Taylor & Zafman

(57) ABSTRACT

A method for fabricating a semiconductor device is provided. The method includes: preparing a substrate defined as active regions and inactive regions and provided with a plurality of conductive patterns; forming a buffer layer over the plurality of conductive patterns; forming an organic material having fluidity better than that of a photoresist layer on the buffer layer; flowing the organic material between the conductive patterns through a thermal treatment process, thereby filling a portion of each gap between the conductive patterns; forming the photoresist layer over the organic material and the buffer layer; forming a plurality of photoresist patterns opening the active regions through a photo-exposure process and a developing process; and performing an ion-implantation process using the plurality of photoresist patterns, thereby forming a plurality of junction regions in the active regions of the substrate.

7 Claims, 4 Drawing Sheets

METHOD FOR FABRICATING SEMICONDUCTOR DEVICE

FIELD OF THE INVENTION

The present invention relates to a method for fabricating a semiconductor device; and more particularly, to a method for fabricating a semiconductor device including an ion implantation mask that can be suitably used even in the case of a high aspect ratio.

DESCRIPTION OF THE RELATED ARTS

As for fabrication of semiconductor devices, a conductive layer such as a gate electrode is formed and then, a series of ion-implantation processes is performed to define an active region and an inactive region. During performing the ion-implantation processes, in case that an aspect ratio is increased due to a decreased pattern size, as shown in FIG. 1, an empty space, i.e., a void, is generated inside a photoresist 12 deposited on a substrate 10 provided with various elements. Herein, a reference numeral 14 indicates the conductive layer and a reference numeral 16 indicates a buffer layer.

In the case that the void is generated inside of the photoresist 12, a dopant used in the ion-implantation process can easily penetrate into the inactive region of the substrate 10. Thus, a plurality of junction regions 15A and 15B are formed in both the active region and the inactive region. Herein, the reference numeral 15A denotes the junction region formed in the active region and the reference numeral 15B denotes the junction region formed in the inactive region. This penetration of the dopant may induce a defect in the device. To prevent the defect generation due to the dopant penetration, the photoresist 12 should have a thickness of at least 2,000 Å.

Particularly, as the integration scale of semiconductor devices has been acceraleted, an aspect ratio in a cell region has been increased. Thus, during performing a selective ion-implantation process in a certain region, a void may be frequently generated inside of a photoresist, thereby increasing a chance of a defect generation. Accordingly, it is necessary to develop a technology that can provide a solution to the aforementioned limitation.

SUMMARY OF THE INVENTION

It is, therefore, an object of the present invention to provide a method for fabricating a semiconductor device capable of preventing a void from being generated inside a photoresist layer used as an ion-implantation mask during performing an ion-implantation process and decreasing a defect generation caused by blocking a dopant from penetrating into an inactive region of a substrate through the aforementioned void.

In accordance with one aspect of the present invention, there is provided a method for fabricating a semiconductor device including: preparing a substrate defined as active regions and inactive regions and provided with a plurality of conductive patterns; forming a buffer layer over the plurality of conductive patterns; forming an organic material having fluidity better than that of a photoresist layer on the buffer layer; flowing the organic material between the conductive patterns through a thermal treatment process, thereby filling a portion of each gap between the conductive patterns; forming the photoresist layer over the organic material and the buffer layer; forming a plurality of photoresist patterns opening the active regions through a photo-exposure process and a developing process; and performing an ion-implantation process using the plurality of photoresist patterns, thereby forming a plurality of junction regions in the active regions of the substrate.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions of preferred embodiments of the present invention will be provided with reference to the accompanying drawings.

FIGS. 2A to 2E are cross-sectional views illustrating a method for fabricating a semiconductor device in accordance with one embodiment of the present invention. Herein, a reference denotation A indicates a region to which a dopant is implanted through an ion-implantation process and a reference denotation B indicates a region where the dopant is not implanted.

Figure 1:
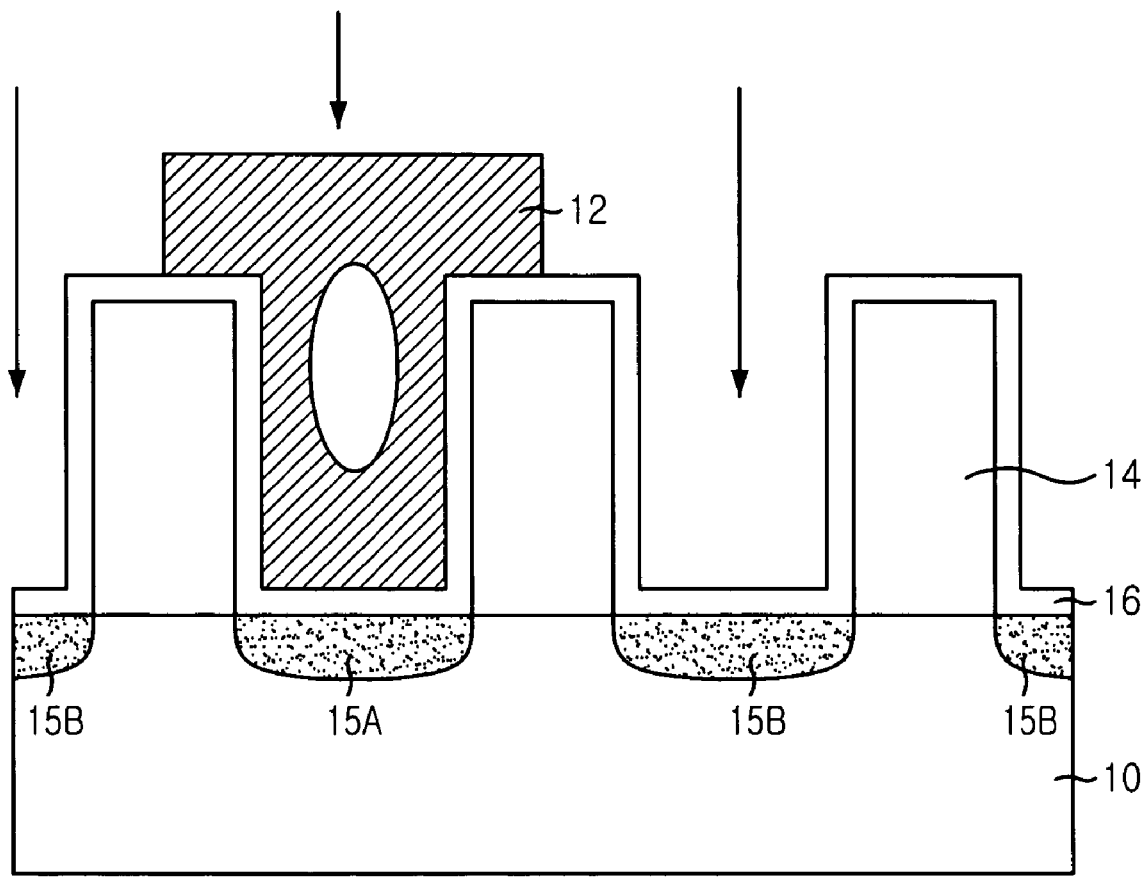
FIG. 1 is a cross-sectional view illustrating a void generated inside a photoresist layer fabricated through a conventional method for fabricating a semiconductor device.
Figure 2A:
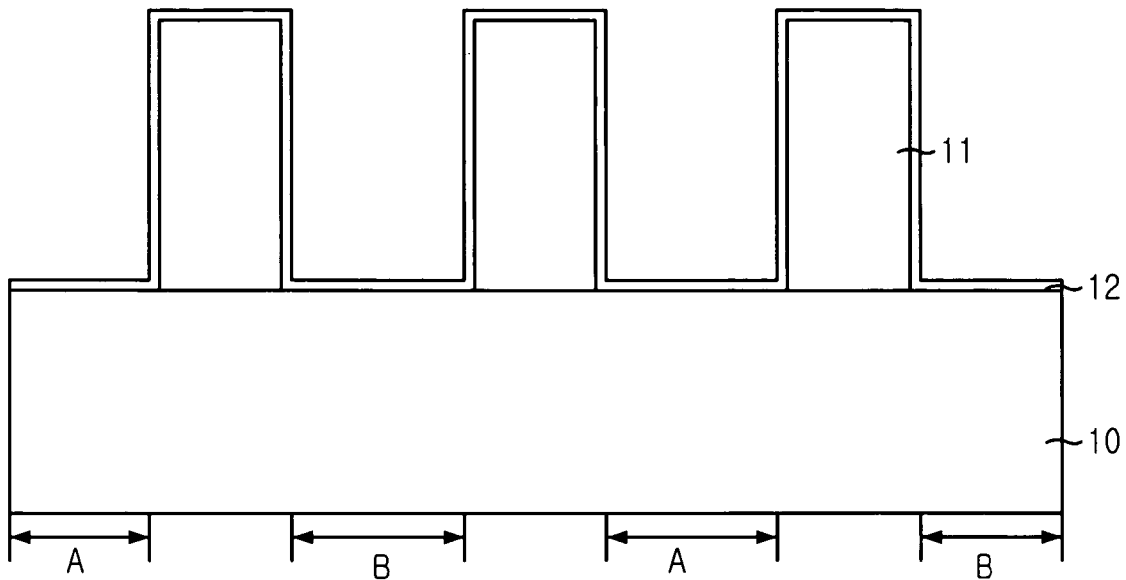
FIGS. 2A to 2E are cross-sectional views illustrating a method for fabricating a semiconductor device in accordance with one embodiment of the present invention.

Although not shown, a conductive layer is deposited on a substrate 10 and then, as shown in FIG. 2A, a plurality of conductive patterns 11 are formed on the substrate 10 through a series of fabrication processes. Herein, the plurality of conductive patterns 11 may be a gate electrode functioning as a word line in a dynamic random access memory (DRAM) device or a gate electrode formed in a cell region in a flash memory device. In the case of the DRAM device, each of the conductive patterns 11 includes a gate oxide layer, a polysilicon layer, a tungsten or tungsten silicide layer, and a hard mask. In the case of the flash memory device, each of the conductive patterns 11 includes a gate oxide layer, a floating gate, a dielectric layer, a control gate, and a tungsten silicide layer.

Subsequently, a buffer layer 12 made of an oxide layer or a nitride layer is deposited over the conductive patterns 11.

Figure 2B:
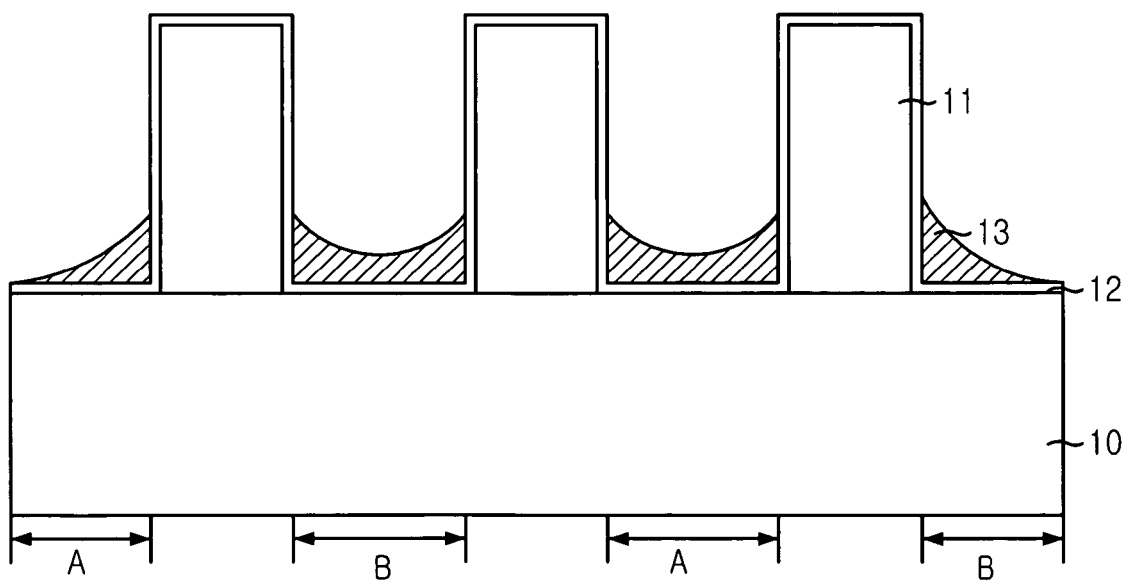

Subsequently, as shown in FIG. 2B, a barrier layer 13 for preventing a void generation in photoresist is deposited on the buffer layer 12 by using an organic material having better fluidity than that of photoresist. At this time, the aforementioned organic material can use all kinds of organic materials used as a reflective coating layer. The barrier layer 13 is deposited more thinly than a photoresist layer 14 (refer to FIG. 2C). In addition, other materials having fluidity better than that of photoresist can be used for the barrier layer 13.

Next, the barrier layer 13 is flowed between the conductive patterns 11 through a thermal treatment process. At this time, the thermal treatment process is performed at a temperature ranging from approximately 100° C. to approximately 300° C. for approximately 10 seconds to approximately 1,000 seconds. Thus, the barrier layer 13 is deposited between the conductive patterns 11 in a thickness ranging from approximately 100 Å to approximately 1,500 Å.

Next, the barrier layer 13 deposited in unnecessary regions except for these regions where the barrier layer 13 is deposited on the substrate 10 disposed between the conductive patterns 11. That is, portions of the barrier layer 13 formed on upper parts of the conductive patterns 11 can be removed by using a gas selected from a group consisting of oxygen ($O_2$) plasma, nitrogen ($N_2$) plasma and a combination thereof.

Figure 2C:
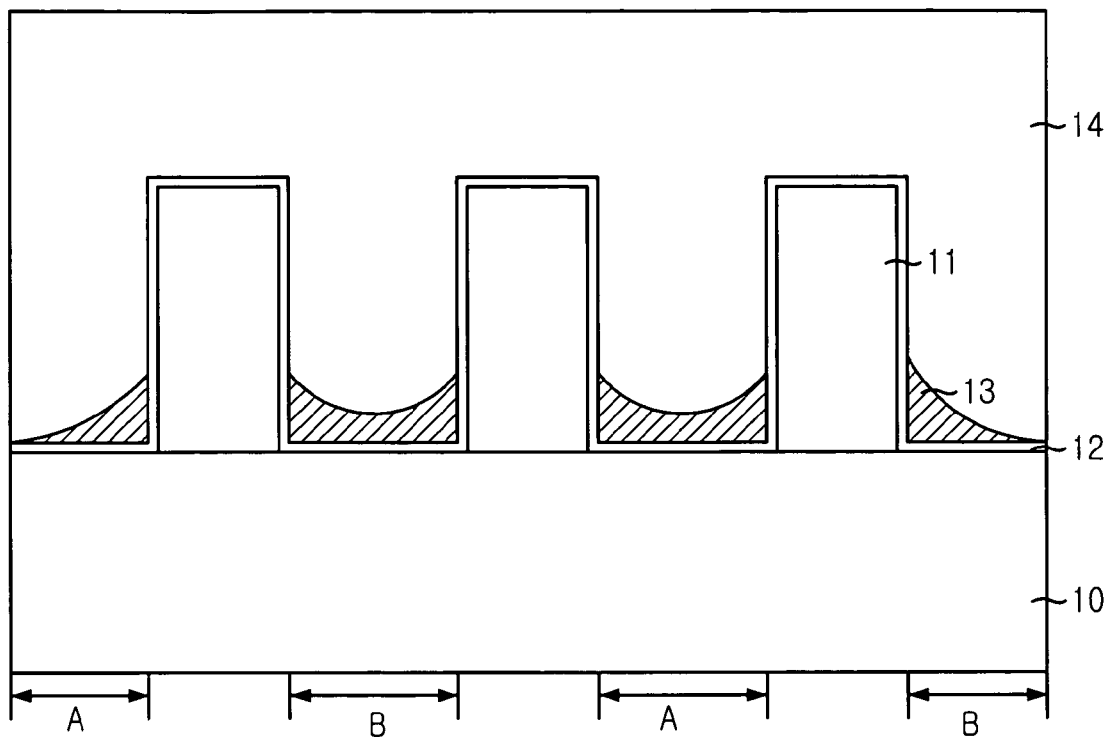

Next, as shown in FIG. 2C, a photoresist layer 14 is deposited on the above resulting substrate structure.

Figure 2D:
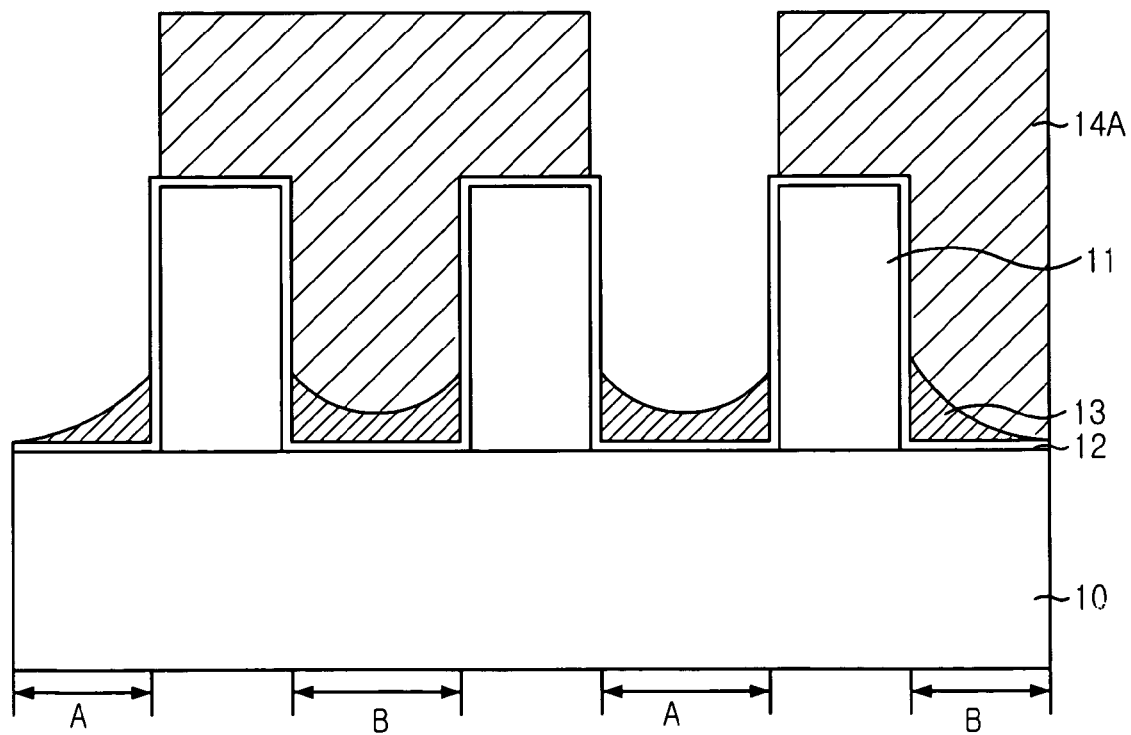

Next, as shown in FIG. 2D, a photo-exposure process and a developing process are performed by using a photo-mask, thereby forming a plurality of photoresist patterns 14A opening those regions A where the dopant is to be doped, i.e., the active regions.

Next, by-products generated during forming the plurality of photoresist patterns 14A and the barrier layer 13 still remaining on unnecessary regions can be removed by using $O_2$ or nitrogen oxide ($N_2O$) plasma.

Figure 2E:
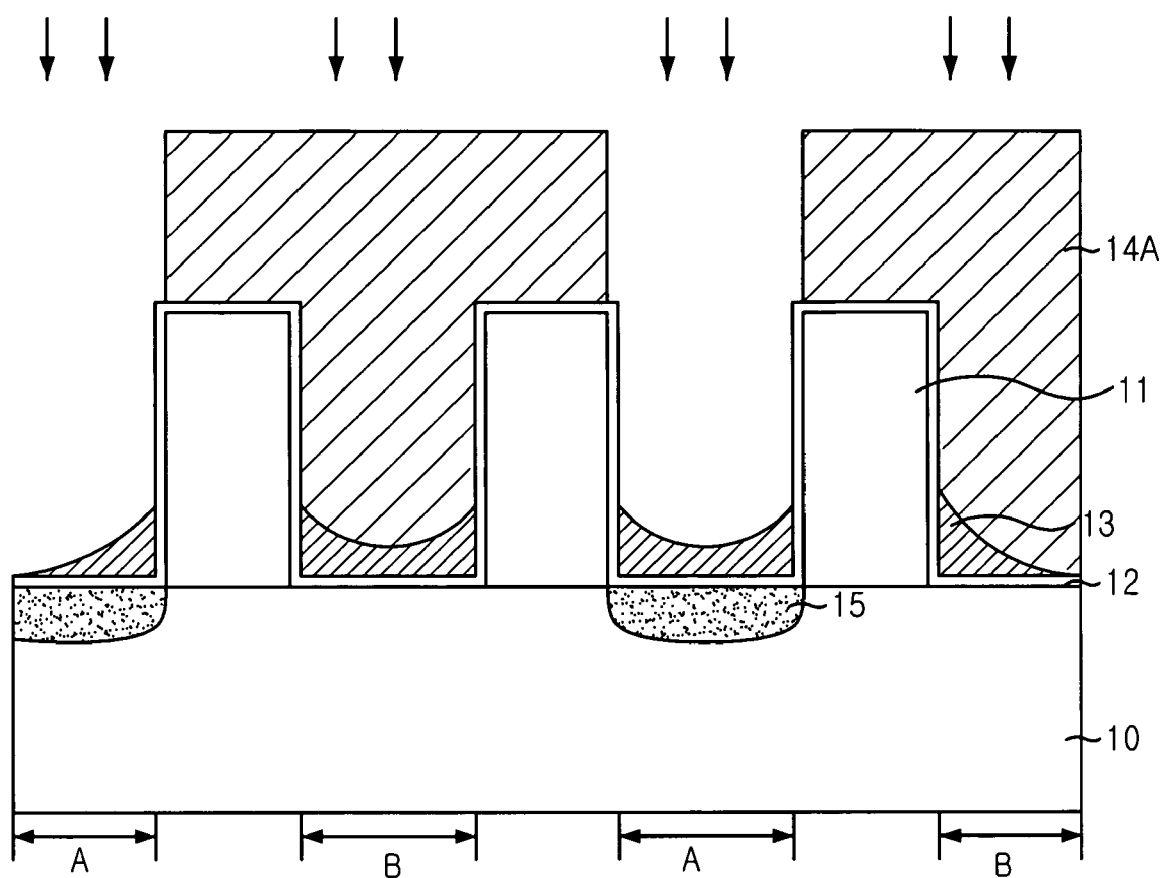

Next, as shown in FIG. 2E, an ion-implantation process is performed by using the plurality of photoresist patterns 14A as a mask, thereby forming a plurality of junction regions 15 in the active regions A of the substrate 10.

In accordance with the embodiment of the present invention, prior to performing the ion-implantation process, because of an increased aspect ratio, the organic material having fluidity better than that of the photoresist is deposited in advance on regions where the photoresist is poorly deposited. Afterwards, the photoresist layer is deposited thereon. Accordingly, it is possible to prevent a void from being generated inside the photoresist layer so that a defect generation in devices can be minimized by blocking a dopant from penetrating into these inactive regions of the substrate where the dopant is not implanted.

The present application contains subject matter related to the Korean patent application No. KR 2004-0108684, filed in the Korean Patent Office on Dec. 20, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
    preparing a substrate defined as active regions and inactive regions and provided with a plurality of conductive patterns;
    forming a buffer layer over the plurality of conductive patterns;
    forming an organic material having fluidity better than that of a photoresist layer on the buffer layer;
    flowing the organic material between the conductive patterns through a thermal treatment process, thereby filling a predeterminded portion of each gap between the conductive patterns to prevent the formation of voids;
    forming the photoresist layer without voids on the portions of the organic material and the buffer layer between the plurality of conductive patterns;
    forming a plurality of photoresist patterns, opening the active regions through a photo-exposure process and a developing process, wherein the organic material remains over the active regions, and the photoresist patterns and the organic material remain over the inactive regions; and
    performing an ion-implantation process using the plurality of photoresist patterns, thereby forming a plurality of junction regions in the active regions of the substrate.

2. The method of claim 1, wherein the thermal treatment process is performed at a temperature ranging from approximately 100° C. to approximately 300° C. for approximately 10 seconds to approximately 1,000 seconds.

3. The method of claim 1, wherein the organic material filled into the portion of the gap between the plurality of conductive patterns has a thickness ranging from approximately 100 Å to approximately 1,500 Å through the thermal treatment process.

4. The method of claim 1, after the forming the organic material, further including removing the organic material deposited on regions except for regions where the organic material is formed on the substrate disposed between the plurality of conductive patterns by using a gas selected from a group consisting of oxygen ($O_2$) plasma, nitrogen ($N_2$) plasma and a combination thereof.

5. The method of claim 4, further including removing by-products generated after the plurality of photoresist patterns are formed by using one of $O_2$ plasma and nitrogen oxide ($N_2O$) plasma.

6. The method of claim 1, further including removing by-products generated after the plurality of photoresist patterns are formed by using one of $O_2$ plasma and nitrogen oxide ($N_2O$) plasma.

7. The method of claim 1, wherein the organic material is formed more thinly than the photoresist layer.

* * * * *